US 6,624,451 B2

(12) United States Patent
Ashley et al.

(10) Patent No.: US 6,624,451 B2
(45) Date of Patent: Sep. 23, 2003

(54) HIGH FREQUENCY FIELD EFFECT TRANSISTOR WITH CARRIER EXTRACTION TO REDUCE INTRINSIC CONDUCTION

(75) Inventors: Timothy Ashley, Malvern (GB); Anthony B. Dean, Malvern (GB); Charles T. Elliott, Malvern (GB); Timothy J. Phillips, Malvern (GB)

(73) Assignee: Qinetiq Limited, London (GB)

( * ) Notice: Subject to any disclaimer, the term of this patent is extended or adjusted under 35 U.S.C. 154(b) by 173 days.

(21) Appl. No.: 09/860,770

(22) Filed: May 21, 2001

(65) Prior Publication Data

US 2002/0014633 A1 Feb. 7, 2002

Related U.S. Application Data

(63) Continuation-in-part of application No. 09/554,492, filed as application No. PCT/GB98/01695 on Jun. 10, 1998, now abandoned.

(30) Foreign Application Priority Data

Nov. 28, 1997 (GB) .............................................. 9725189

(51) Int. Cl.[7] ......................................... H01L 31/0328
(52) U.S. Cl. ...................................... 257/192; 257/200
(58) Field of Search ................................ 257/192, 194, 257/183, 187, 188–191, 195, 196, 200, 615, 613, 201, 197; 438/235, 309, 312, 285, 590, 752, 933

(56) References Cited

U.S. PATENT DOCUMENTS 4,927,782 A * 5/1990 Davey et al.
5,382,814 A    1/1995 Ashley
5,610,090 A * 3/1997 Jo
5,712,496 A * 1/1998 Takahashi et al.

FOREIGN PATENT DOCUMENTS

EP        0 040 263 A    11/1981

OTHER PUBLICATIONS

Ashley et al, "Uncooled High–Speed InSb Field–Effect Transistors", *Applied Physics Letters*, vol. 66, No. 4, Jan. 23, 1995, pp. 481–483.
Ashley et al, "High–speed, low–power InSb transistors", *International Electron Devices Meeting*, 1997, pp. 751–754.
Fujisada, "Planar type p–channel InSb–MAOSFET", *Japanese Journal of Applied Physics, Part 2*, vol. 24, No. 10, Oct. 1985, pp. L835–L837.
Sze, "Physics of Semiconductor Devices" Second Edition, p. 439.

* cited by examiner

Primary Examiner—Nathan J. Flynn
Assistant Examiner—Kevin Quinto
(74) Attorney, Agent, or Firm—Nixon & Vanderhye P.C.

(57) ABSTRACT

A field effect transistor (FET) is of the type which employs base biasing to depress the intrinsic contribution to conduction and reduce leakage current. It incorporates four successive layers (102 to 108): a $p^+$ InSb base layer (102), a $p^+$ InAlSb barrier layer (104), a π intrinsic layer (106) and an insulating $SiO_2$ layer (108); $p^+$ source and drain regions (110, 112) are implanted in the intrinsic layer (106). The FET is an enhancement mode MISFET (100) in which biasing establishes the FET channel in the intrinsic layer (106). The insulating layer (108) has a substantially flat surface supporting a gate contact (116). This avoids or reduces departures from channel straightness caused by intrusion of a gate groove, and enables a high value of current gain cut-off frequency to be obtained. In FETs with layers that are not flat, departures from channel straightness should not be more than 50 nm in extent, preferably less than 5 nm.

21 Claims, 10 Drawing Sheets

HIGH FREQUENCY FIELD EFFECT TRANSISTOR WITH CARRIER EXTRACTION TO REDUCE INTRINSIC CONDUCTION

BACKGROUND OF THE INVENTION

The present application is a continuation-in-part of U.S. application Ser. No. 09/554,492 filed May 16, 2000, now abandoned which is a 371 of PCT/GB98/01695 filed Jun. 10, 1998 which claims priority from UK application number GB9725189.6 filed Nov. 28, 1997, the subject matter of all of the recited priority documents herein incorporated by reference.

FIELD OF THE INVENTION

This invention relates to a field effect transistor (FET). More particularly, although not exclusively, it relates to FETs such as MISFETs made from narrow bandgap semiconductor materials, ie bandgap EG in the region of or less than 0.5 eV. It is also relevant to FETs made from wider bandgap materials for use at elevated operating temperatures above ambient temperature.

DISCUSSION OF PRIOR ART

Narrow bandgap semiconductors such as indium antimonide (InSb) have useful properties such as very low electron effective mass, very high electron mobility and high saturation velocity. These are potentially of great interest for ultra high speed applications. InSb in particular is a promising material for fast, very low power dissipation transistors, because its electron mobility $\mu_e$ at low electric fields is nine times higher than that of GaAs and its saturation velocity $v_{sat}$ is more than five times higher, despite GaAs having good properties in these respects. InSb is also predicted to have a large ballistic mean free path of over 0.5 $\mu$m. This suggests that InSb has potential for high speed operation at very low voltages, allowing low power consumption, which would make it ideal for portable and high-density applications. Some of the properties of Silicon, GaAs and InSb at 295 K (ambient temperature) are compared in Table 1 as follows:

TABLE 1

Properties of InSb at 295 K

| Parameter | Silicon | GaAs | InSb | Units |
|---|---|---|---|---|
| $E_G$ Bandgap | 1.12 | 1.43 | 0.175 | eV |
| $m^*_e$ Electron Effective Mass | 0.19 | 0.072 | 0.013 | $m_0$ |
| $\mu_e$ Electron Mobility | 1,500 | 8,500 | 78,000 | $cm^2 V^{-1} s^{-1}$ |
| $v_{sat}$ Saturation Velocity | $1 \times 10^7$ | $1 \times 10^7$ | $>5 \times 10^7$ | $cm\ s^{-1}$ |
| $\lambda_e$ Electron Mean Free Path | 0.04 | 0.15 | 0.58 | $\mu m$ |
| $n_i$ Intrinsic Carrier Concentration | $1.6 \times 10^{10}$ | $1.1 \times 10^7$ | $1.9 \times 10^{16}$ | $cm^{-3}$ |

Until recently, the potentially valuable properties of InSb have been inaccessible at ambient temperatures due to its low band-gap and consequently high intrinsic carrier concentration (~$2 \times 10^{16}$ $cm^{-3}$), which is six and nine orders of magnitude above those of Si and GaAs respectively. This leads to InSb devices exhibiting high leakage currents at normal operating temperatures at or near ambient temperature of 295K, where the minority carrier concentration is much greater than the required value at normal doping levels. It was thought for many years that this was a fundamental problem which debarred InSb and other narrow bandgap materials from use in devices at ambient temperature and above. The problem was however overcome by means of the invention the subject of U.S. Pat. No. 5,382,814, which discloses a non-equilibrium metal-insulator-semiconductor field effect transistor (MISFET) using the phenomena of carrier exclusion and extraction to reduce the intrinsic contribution to the carrier concentration well below the equilibrium level. This prior art MISFET is a reverse-biased $p^+\underline{p}^+\pi n^+$ structure, where p denotes an InSb layer, $\underline{p}$ is a strained $In_{1-x}Al_xSb$ layer (underlined $\underline{p}$ indicates wider band-gap than p), $\pi$ indicates a weakly doped p-type region that is intrinsic at ambient operating temperature, and the + superscript indicates a heavy dopant concentration; these four layers define three junctions between respective adjacent layer pairs, ie $p^+\underline{p}^+$, $\underline{p}^+\pi$ and $\pi n^+$ junctions respectively. The active region of the device is the $\pi$ region, and minority carriers are removed from it at the $\pi n^+$ junction acting as an extracting contact. The $\underline{p}^+\pi$ junction is an excluding contact inhibiting re-introduction of these carriers. In consequence, under bias applied to the device the minority carrier concentration falls, and the majority carrier concentration falls with it to preserve charge neutrality. This produces carrier concentrations below intrinsic levels. A similar effect is produced by cooling. Here the expression "intrinsic" is used with its normal construction to mean that carriers arise largely from activation of valence states, and approximately equal numbers of minority and majority carriers are present in the semiconductor material. This expression is sometimes wrongly used for extrinsic material (eg Si) to indicate simply that the doping level is low, whereas in extrinsic material carriers arise largely from activation of either donor or acceptor states and one type of carrier (electrons or holes) predominates.

The device disclosed in U.S. Pat. No. 5,382,814 was a 1 $\mu$m recessed-gate enhancement-mode MISFET structure. For investigation purposes a variety of devices of this kind were produced. It was predicted theoretically that the frequency $f_T$ at which the current gain would fall to unity in a device of this kind would be 55 GHz, but measured values were obtained which were only in the region of 10 GHz. The value of $f_T$ is treated as a figure of merit by those skilled in the art of high frequency transistors. The best value of $f_T$ obtained for any of these devices was 17 GHz, despite attempts to limit device capacitance associated with overlap of gate contact metal on to source and drain regions. This indicates that it is difficult to realise the full high frequency potential of InSb MISFETs.

SUMMARY OF THE INVENTION

It is an object of the invention to provide an alternative form of FET capable of exhibiting an improved value of current gain cut-off frequency $f_T$.

The present invention provides a field effect transistor (FET) of the kind including a region having intrinsic conductivity when unbiased at an operating temperature of the FET and biasing means for depressing the intrinsic contribution to the charge carrier concentration in the intrinsic region, characterised in that the FET also includes means for defining a channel extending between a source region and a drain region with any intervening departure from channel straightness being not more than 50 nm in extent, as appropriate to enable a high value of current gain cut-off frequency to be obtained. Any such departure from channel straightness is preferably not more than 5 nm in extent; the expression "extent" means the maximum height differential between any two regions of the channel, eg its central region and a region adjacent to the source or drain.

The invention provides the advantage that it is capable of providing greatly enhanced values of current gain cut-off frequency compared to the prior art, indicating greatly improved high frequency performance. MISFETs in particular in accordance with the prior art were found to have disappointing performance at high frequency much below theoretical expectations. The reason for this was originally not understood. However, a number of hypotheses were investigated in an attempt to resolve the problem. One of these hypotheses was that over-etching a MISFET gate recess might degrade high frequency performance. Devices of the invention produced without an intervening gate groove intrusion have exhibited much better performance at high frequency, and it is inferred that the hypothesis of the deleterious effect of gate grooving on performance is confirmed.

In one aspect, the FET of the invention is an enhancement mode MISFET; it may incorporate source and drain regions which are produced by introduction of heavy doping into a layer incorporating the intrinsic region The source and drain regions may be produced by implantation, diffusion doping, alloying or introduction of damage. The intrinsic region may be residually p-type doped and form extracting contact means with the source and drain regions, the channel formed in the intrinsic region in response to bias being n-type.

In a preferred embodiment, the intrinsic region has an interface with a barrier region itself having an interface with a base region, and the intrinsic, barrier and base regions (106, 104, 102) being of like conductivity type and the barrier region being of relatively wider bandgap than the intrinsic and base regions and providing an excluding contact to the intrinsic region.

The FET of the invention may include a gate contact insulated from and extending at least over that part of the intrinsic region between the source and drain regions to define an enhancement channel therebetween in operation. The base region may be of $p^+$ InSb with a dopant concentration of at least $5 \times 10^{17}$ cm$^{-3}$; the barrier region may be of $p^+$ In$_{1-x}$Al$_x$Sb with x in the range 0.05 to 0.25 with a dopant concentration of at least $5 \times 10^{17}$ cm$^{-3}$; the intrinsic region may be of π InSb with a dopant concentration of less than $5 \times 10^{17}$ cm$^{-3}$, preferably $1 \times 10^{15}$ cm$^{-3}$ to $5 \times 10^{16}$ cm$^{-3}$ and the source and drain regions may be of $n^+$ InSb with a dopant concentration of at least $5 \times 10^{17}$ cm$^{-3}$.

The base, barrier and intrinsic regions are preferably successively disposed in a layer structure, the source and drain regions being produced by implantation, diffusion alloying or damage in the intrinsic region, and the intrinsic region preferably has a substantially flat surface portion supporting a gate insulation layer and a gate contact.

In another aspect, the FET of the invention is a depletion mode MISFET having an associated channel region. It may incorporate source and drain regions which are heavily doped outgrowths formed upon either the intrinsic region or the channel region; these regions may alternatively be produced by implantation, diffusion, alloying or introduction of damage. They may define therebetween a gate recess accommodating a gate contact.

The intrinsic region may be p-type and either itself or the channel region may form extracting contact means with the source and drain regions.

In a preferred embodiment, the intrinsic region has an interface with a barrier region which itself has an interface with a base region, the intrinsic, barrier and base regions being of like conductivity type and the barrier region being of relatively wider bandgap than the intrinsic and base regions and providing an excluding contact to the intrinsic region. In this embodiment:

the base region may be of $p^+$ InSb with at least $5 \times 10^{17}$ acceptors cm$^{-3}$;

the barrier region may be of $p^+$In$_{1-x}$Al$_x$Sb with x in the range 0.05 to 0.25 and at least $5 \times 10^{17}$ acceptors cm$^{-3}$;

the intrinsic region is of π InSb with less than $5 \times 10^{17}$ acceptors cm$^{-3}$, preferably in the range $1 \times 10^{15}$ cm$^{-3}$ to $5 \times 10^{16}$ cm$^{-3}$; and the source and drain regions are of $n^+$ InSb with at least $5 \times 10^{17}$ donor cm$^3$.

The intrinsic region may support a channel region, the base, barrier, intrinsic and channel regions being successively disposed in a layer structure, the source and drain regions being grown upon the channel region and the channel region having a substantially flat surface portion supporting a gate insulation layer and a gate contact. The source and drain regions may define therebetween a gate recess, the channel region having a surface portion at an end of the recess supporting the gate insulation layer and gate contact.

The channel region may lie between parts of the intrinsic region, the latter forming extracting contact means in combination with the source and drain regions.

The base, barrier and intrinsic regions are preferably successively disposed in a layer structure, the intrinsic region containing the channel region and supporting the source and drain regions.

The biasing means for depressing the intrinsic contribution to the carrier concentration in the intrinsic region is preferably arranged to bias the FET at a point of infinite differential impedance where the variation of gate threshold voltage due to substrate bias voltage variations is minimised.

In an alternative aspect, the invention provides a method of making an FET of the kind comprising biasing means for depressing the intrinsic contribution to the charge carrier concentration in an intrinsic region thereof, characterised in that the method includes defining a channel extending between a source region and a drain region such that any intervening departure from channel straightness is not more than 50 nm in extent, as appropriate to enable a high value of current gain cut-off frequency to be obtained. Any such departure from channel straightness is preferably not more than 5 nm in extent.

BRIEF DESCRIPTION OF THE DRAWINGS

In order that the invention might be more fully understood, embodiments thereof will now be described, by way of example only, with reference to the accompanying drawings, in which.

DETAILED DESCRIPTION OF PREFERRED EMBODIMENTS

Figure 1:
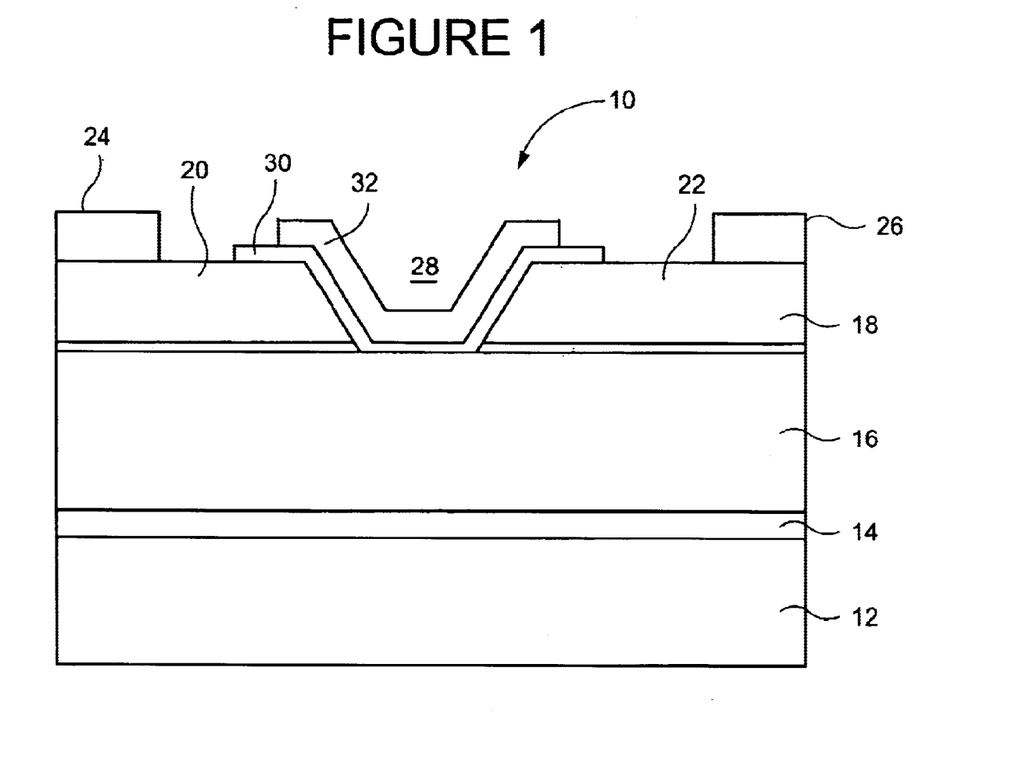
FIG. 1 is a schematic sectional view of a prior art MISFET not drawn to scale.

Referring now to FIG. 1, there is shown a prior art MISFET 10 of the kind disclosed in U.S. Pat No. 5,382,814. The MISFET 10 consists of layers of indium antimonide (InSb) and indium aluminium antimonide ($In_{1-x}Al_xSb$). It has a substrate (not shown) supporting four layers of semiconductor material as follows: a heavily doped narrow bandgap p-type ($p^+$) base layer 12, a relatively wide bandgap heavily doped p-type ($\underline{p}^+$) barrier layer 14, a lightly doped p-type ($\pi$) active layer 16 and a heavily doped narrow bandgap n-type ($n^+$) source/drain layer 18. Layers 12, 16 and 18 are InSb and layer 14 is $In_{1-x}Al_xSb$. The $\pi$ active layer 16 has predominantly intrinsic conductivity at 295K ambient temperature, whereas other layers 12, 14 and 18 have predominantly extrinsic conductivity at this temperature. Interfaces between pairs of adjacent layers 12/14, 14/16 and 16/18 are $p^+\underline{p}^+$, $\underline{p}^+\pi$ and $\pi n^+$ junctions respectively, the first two of these being heterojunctions and the last a homojunction. The $\underline{p}^+\pi$ and $\pi n^+$ junctions 14/16 and 16/18 are an excluding contact and an extracting contact respectively.

The MISFET 10 has source and drain regions 20 and 22 with contacts 24 and 26 respectively, the regions having an intervening gate recess or groove 28 formed by etching through the $n^+$ layer 18. The bottom and sides of the gate depression are covered by a silicon oxide gate insulator 30 and a metal gate contact 32. It is necessary for operation of the MISFET 10 that the recess 28 extend completely (or almost completely) through the $n^+$ layer 18 to avoid a short circuit between the source 20 and drain 22.

Carrier extraction and exclusion take place in the MISFET 10 when bias is applied in normal operation. The layers 12 to 18 form a $p^+\underline{p}^+\pi n^+$ diode which is reverse biased in operation, ie the base layer 12 is biased negative with respect to the source region 20. Under this bias, the $\pi n^+$ junction 16/18 acts as an extracting contact removing electrons (minority carriers) from the $\pi$ layer 16. Such electrons cannot be replenished from the $\underline{p}^+$ barrier layer 14, because it acts in combination with the $p^+$ base layer 12 as an excluding contact and provides a potential barrier to electron flow to the $\pi$ layer 16. The electron concentration in the $\pi$ layer 16 therefore falls when the MISFET 10 is biased, and with it the hole concentration in that layer for charge neutrality reasons. This greatly reduces the conductivity in the layer 16, which therefore reduces the leakage current between the source 20 and drain 22.

Figure 2:
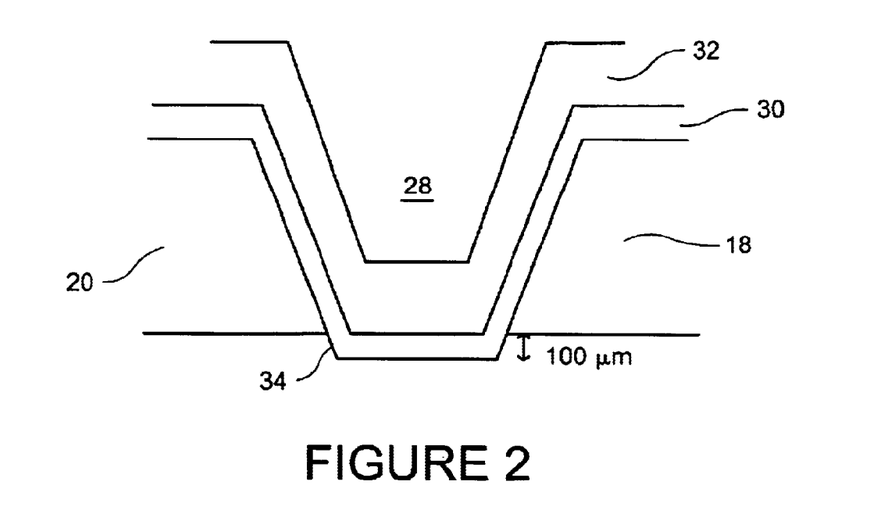
FIG. 2 shows a gate of the prior art MISFET of FIG. 1 on an expanded scale.

As has been said, trial examples of the MISFET 10 have been produced which exhibited disappointing performance at high frequency. The theoretical value of the current gain cut-off frequency $f_T$ (at which the current gain falls to unity) for these devices was 55 GHz, but measured values were only in the region of 10 GHz despite attempts to limit device capacitance associated with overlap of gate metal on to source and drain regions. The reason for this was not understood. However, a number of hypotheses were advanced and investigated theoretically in an attempt to identify a candidate artefact responsible for poor high frequency performance. One of these hypotheses was associated with the depth of the gate recess or groove. Theoretical calculations indicated that, if the gate recess was etched too deeply (which is difficult to control and measure), high frequency performance would be degraded. The theoretical situation is illustrated in FIG. 2, in which the gate recess 28 is shown on an expanded scale.

For the MISFET 10 to be viable, the gate recess 28 must extend through most of—preferably entirely through—the $n^+$ region 18 to avoid a short circuit between source and drain; if this recess were to be over-etched it would continue down into the $\pi$ region 16, and it is postulated that an inverted step 34 was formed in the trial devices of the order of 100 nm in depth. If so, the MISFET channel (not shown) between source 20 and drain 22 would be U-shaped instead of straight as intended (in an enhancement mode MISFET the channel is formed under the gate electrode only in operation in response to application of bias).

To minimise the transit time of charge carriers between source and drain, the source-drain electric field should be directed longitudinally of the channel, which is only possible in that part of a U-shaped channel extending parallel to this field. In such a channel there would be regions in which the channel does not extend in the source-drain direction and the source-drain electric field is therefore inclined to the longitudinal channel direction; in consequence the longitudinal field component would be weaker than would be the case if the field were parallel to this direction, which increases the transit time of charge carriers between source and drain as compared to the case where the field is entirely longitudinal. It is therefore deduced that a U-shaped channel would degrade $f_T$ because the latter is related to this transit time. If correct, this theoretical analysis implies that an etched gate recess should be avoided. This hypothesis was tested by the production of examples of the invention hereinafter set out.

Figure 3:
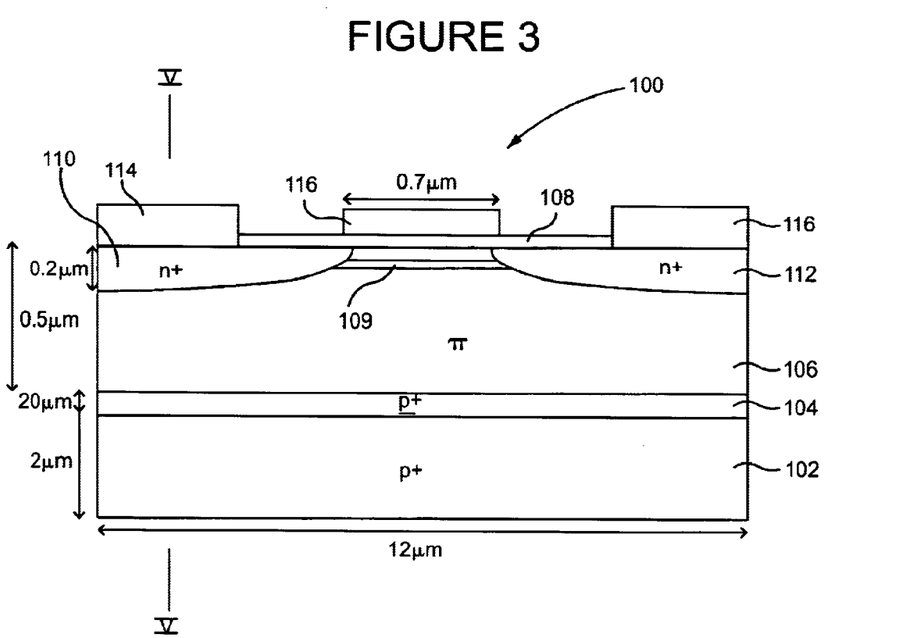
FIG. 3 is a schematic sectional view of an n-channel enhancement mode MISFET of the invention (not drawn to scale) illustrated in idealised form with layers that are neither concave nor convex.

Referring now to FIG. 3, an enhancement mode MISFET of the invention is indicated generally by 100. It comprises a weakly doped p-type InSb substrate (not shown) upon which are grown in succession first, second, third and fourth layers 102, 104, 106 and 108 having the following thicknesses and compositions:

first (base) layer 102: $p^+$ InSb 2 $\mu$m thick, Be dopant concentration $3\times10^{18}$ cm$^{-3}$;

second (barrier) layer 104: $\underline{p}^+$ $In_{0.85}Al_{0.15}Sb$ 20 nm thick, Be dopant concentration $3\times10^{18}$ cm$^{-3}$;

third (intrinsic) layer 106: $\pi$ InSb 0.5 $\mu$m thick, Be dopant concentration $1\times10^{15}$ cm$^{-3}$; and fourth (insulating) layer 108: $SiO_2$ 70 nm thick.

More generally, suitable compositions for InSb/InAlSb FETs of the invention are as follows:

base region: $p^+$ InSb with an acceptor concentration of at least $5\times10^{17}$ cm$^{-3}$;

barrier region: $\underline{p}^+$ $In_{1-x}Al_xSb$ with x in the range 0.05 to 0.25 and an acceptor concentration of at least $5\times10^{17}$ cm$^{-3}$; and intrinsic region: π InSb with an acceptor concentration of less than $5 \times 10^{17}$ cm$^{-3}$, preferably in the range $1 \times 10^{15}$ cm$^{-3}$ to $5 \times 10^{16}$ cm5$^{-3}$.

The MISFET 100 may optionally include a buried p-type layer 109 (indicated by chain lines) within the channel layer 106 to improve confinement of charge carriers near the insulating layer 108. It has n$^+$ source and drain regions 110 and 112 each approximately 0.2 μm thick with a neutral acceptor concentration of at least $5 \times 10^{17}$ cm$^{-3}$. It has source, gate and drain contacts 114, 116 and 118 consisting of successive Cr and Au layers (not shown). The mesa length of the MISFET 100 is 12 μm, this being its full width in the plane of the drawing. It has a mesa (and gate) width of 50 μm, this being the dimension extending perpendicular to the plane of the drawing. The length of the gate contact 116 (horizontal dimension in the plane of the drawing) was nominally 0.7 μm; here "nominally" means that lithographic masks were used of appropriate dimensions to produce the required length, but the length was not measured. Other devices of similar construction and type were also produced with nominal gate lengths in the range 0.7 to 2 μm and mesa width of 100 μm. The layers 102 to 108 were grown by molecular beam epitaxy. The source and drain regions 110 and 112 were produced by ion implantation using 70 keV S$^{32}$ ions with a dose per unit area of $5 \times 10^{13}$ cm$^{-2}$. The ions were implanted through a native anodic oxide mask at an angle of 10° from the normal to the <110> direction in the crystal with a substrate temperature of 100° C. This was followed by a rapid thermal anneal at 420° C. for 10 seconds with an Si$_3$N$_4$ cap to activate the dopant and remove damage. Samples were then anodised and the oxide was stripped off to remove damaged material before applying contacts. The process of producing the MISFET 100 can result in a minor degree of convexity of the layers 106 and 108, but it does not result in a height differential of more than 50 nm between the central region of the channel (when formed in response to gate bias voltage) and outer regions of the channel adjacent the source and drain. The implantation established conducting paths permitting contact to the source and drain regions 110 and 112.

The fourth layer 108 consisted of 40 nm of sputtered SiO$_2$ deposited on top of 30 nm of anodic oxide. Photolytic SiO$_2$ would have been preferable for the entire layer 108 but this was unavailable.

The gate contact 116 extends over the whole of that part of the third or π layer 106 which is between the source and drain regions 110 and 112, and overlaps these regions a little. Ideally, to minimise device capacitance the overlap would be zero, but in an enhancement mode device it is important for the gate contact to extend fully between these regions so that in operation the channel region can be established as required.

In the MISFET 100 the direct line between source and drain regions 110 and 112 is not significantly obscured by the geometry of the gate 116, certainly not to the extent of 100 nm experienced in the prior art device 10.

Figure 4:
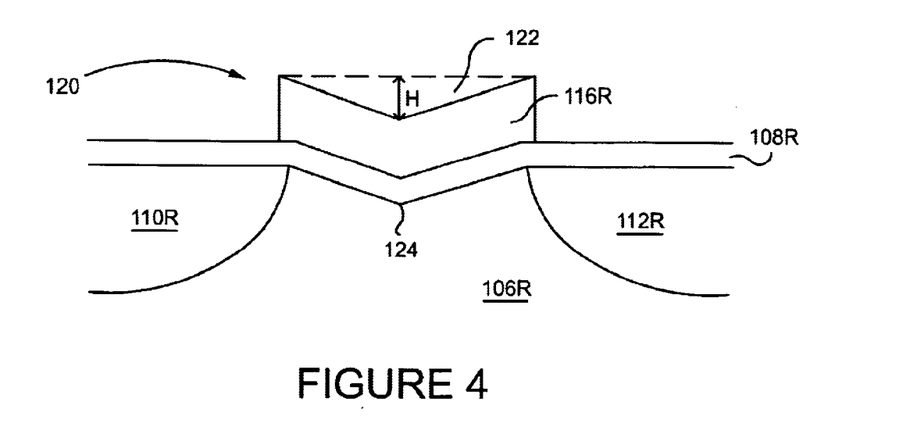
FIG. 4 is a schematic sectional view of a central region of an n-channel enhancement mode MISFET of the invention showing a minor degree of gate region concavity.

FIG. 3 is an idealised illustration, in that in practice an FET of the invention may have non-planar layers because of departures from ideal geometry caused by inaccuracies in the production process; ie the intrinsic region may be concave, convex or undulating so long as this does not result in too severe a distortion of the channel. Concavity is illustrated in FIG. 4, in which parts equivalent to those described with reference to FIG. 3 are like-referenced with a suffix R. FIG. 4 shows a central region 120 of an FET equivalent to the MISFET 100, except that it approximates more closely to a practical device. It includes an intrinsic layer 106R, a gate insulation layer 108R and gate contact 116R all of which are concave defining a V-shaped recess 122. The bottom of the recess 122 is defined by a vertex 124 at the centre of the insulation layer 108R. The recess 122 has a depth indicated by H which is not more than 50 nm. When the channel (not shown) is established in response to application of gate bias voltage, the recess 122 does not result in a differential of more than 50 nm existing in the vertical direction in the drawing between the central region of the channel (not shown) under the vertex 124 and outer regions of the channel adjacent the source 110R and drain 112R; in other words any departure from channel straightness arising from gate region non-planarity will be less than 50 nm. Here the gate region is the upper part of the intrinsic layer 106R adjacent the gate insulation layer 108R in which the channel is formed and which determines the channel shape. In other embodiments of the invention it is the active region of the device accommodating the central region of the channel.

The recess depth H and any consequent departure from channel straightness are preferably not more than 5 nm. In consequence, the channel when established can extend substantially as determined by the source, gate and drain voltages. As will be described later, this gives rise to greatly improved performance as compared to the prior art device 10.

Figure 5:
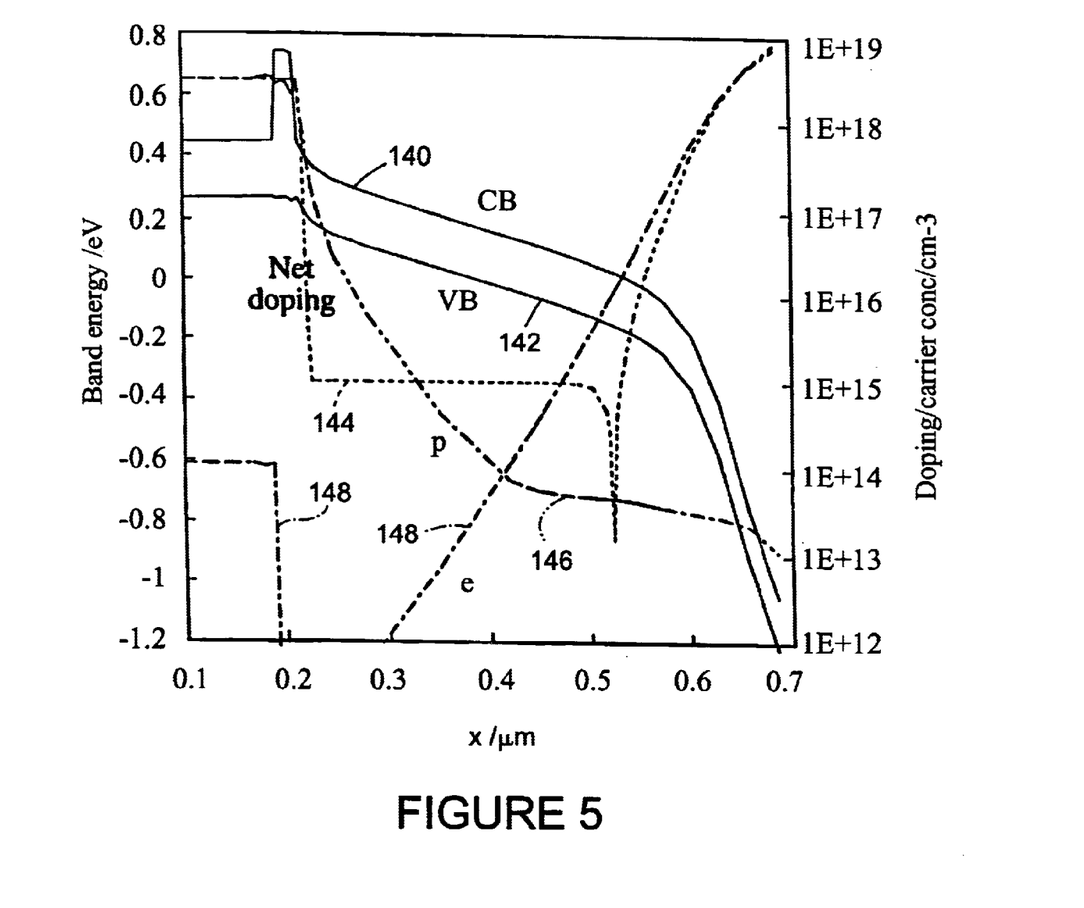
FIG. 5 is a band structure diagram for a reverse-biased $p^+$ $p^+$π$n^+$ MISFET structure of the invention; it corresponds to a section on lines V—V in FIG. 3.

FIG. 5 provides a band structure diagram and associated charge carrier densities in the MISFET 100 and as a function of vertical distance x in μm measured from the lower edge of the first layer 102. The data given in this drawing are for a reverse-biased p$^+$p$^+$πn$^+$ structure; they relate to a vertical section through the MISFET 100 on lines V—V in FIG. 3 extending through the first (p$^+$), second (p$^+$) and third (π) layers 102, 104 and 106 and the (n$^+$) source region 110. The right hand ordinate is graduated in 1E+12 to 1E+19, which indicates $10^{12}$ to $10^{19}$ cm$^{-3}$. The drawing shows the following variations, conduction and valence band energies in graphs 140 and 142, net dopant concentration in graph 144, and hole and electron concentrations in graphs 146 and 148 respectively.

The intrinsic carrier concentration at 295K (ambient) in InSb is $2 \times 10^{16}$ cm$^{-3}$. Graphs 146 and 148 show that in operation the actual carrier concentrations are up to two orders of magnitude less than this throughout most of the active a region of the third layer 106, which corresponds to the approximately flat portion of graph 144. This demonstrates that the carrier concentrations in the π region of the layer 106 are being depressed by carrier exclusion and extraction arising respectively from the p$^+$π and πn$^+$ junctions 104/106 and 106/112.

The MISFET 100 was tested in a common-source configuration with the base layer 102 biased to about −0.35 V relative to the source 114 to perform the carrier extraction; this voltage is defined as $V_{bs}$ and corresponds to the position of maximum dynamic resistance of the diode structure provided by the base layer 102 and the source 110 or drain 112. Drain and gate voltages of normal polarity were then applied, ie they were both biased positive relative to the source 110 apart from one case where a small negative gate-source voltage was used.

Figure 6:
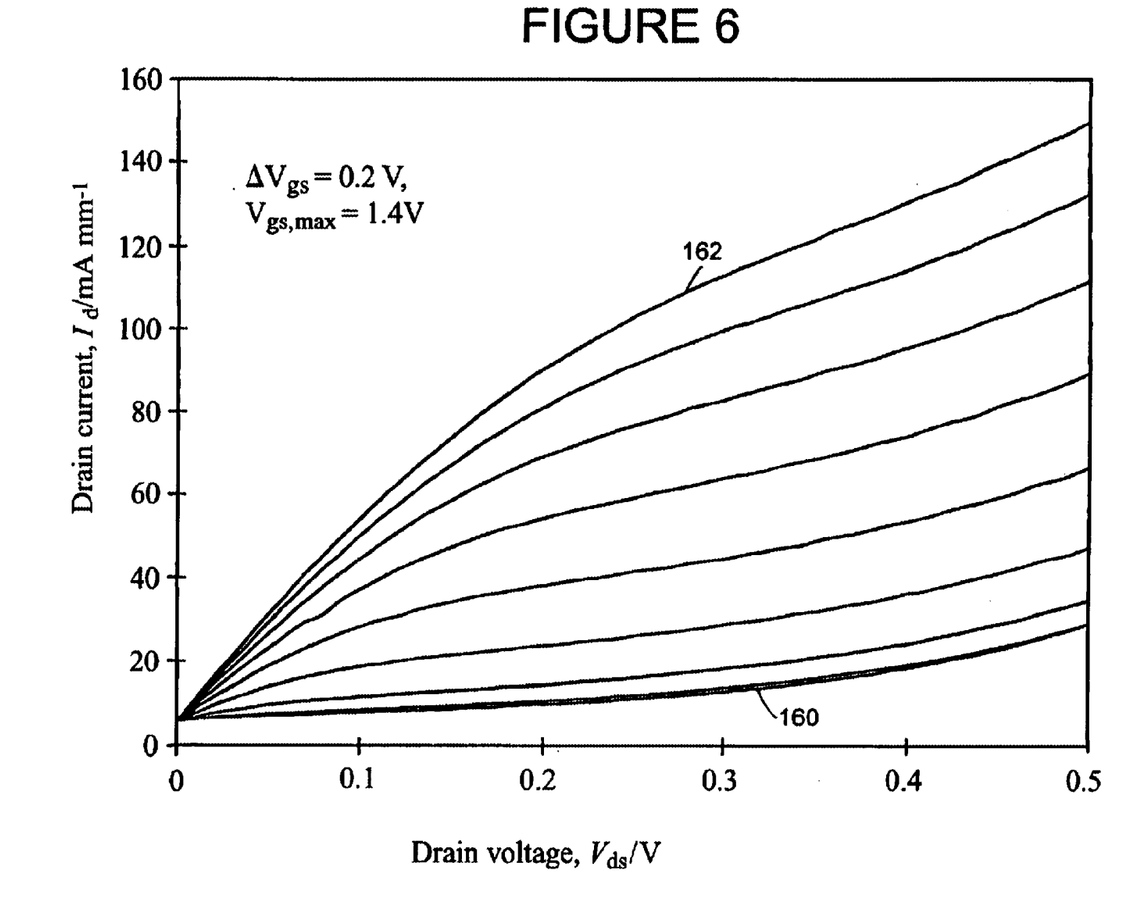
FIG. 6 graphically illustrates the output characteristic of the FIG. 3 MISFET.

The output characteristic of the MISFET 100 is shown in FIG. 6. It comprises nine graphs such as 160 and 162 indicating the variation of drain current $I_d$ with drain voltage $V_{ds}$ at constant gate voltage $V_{gs}$ from −0.2 V to 1.4 V in steps of 0.2 V between adjacent graphs. It can be seen that the drain current starts to saturate at a drain voltage of about 0.15 V, as indicated by a slight knee in each graph; this is a very low voltage for saturation to initiate, and it is due broadly speaking to the electron mobility in InSb being very high. It is advantageous because it implies that the MISFET 100 will have low power requirements. The output characteristic is generally of the classical form for MISFETs, which is evidence that a viable MISFET has been produced. At a drain voltage $V_{ds}$ of 0.3 V the drain current is switchable between about 10 and 110 mAmm$^{-1}$ by changing the gate voltage $V_{gs}$ from −0.2 to 1.2 V.

Figure 7:
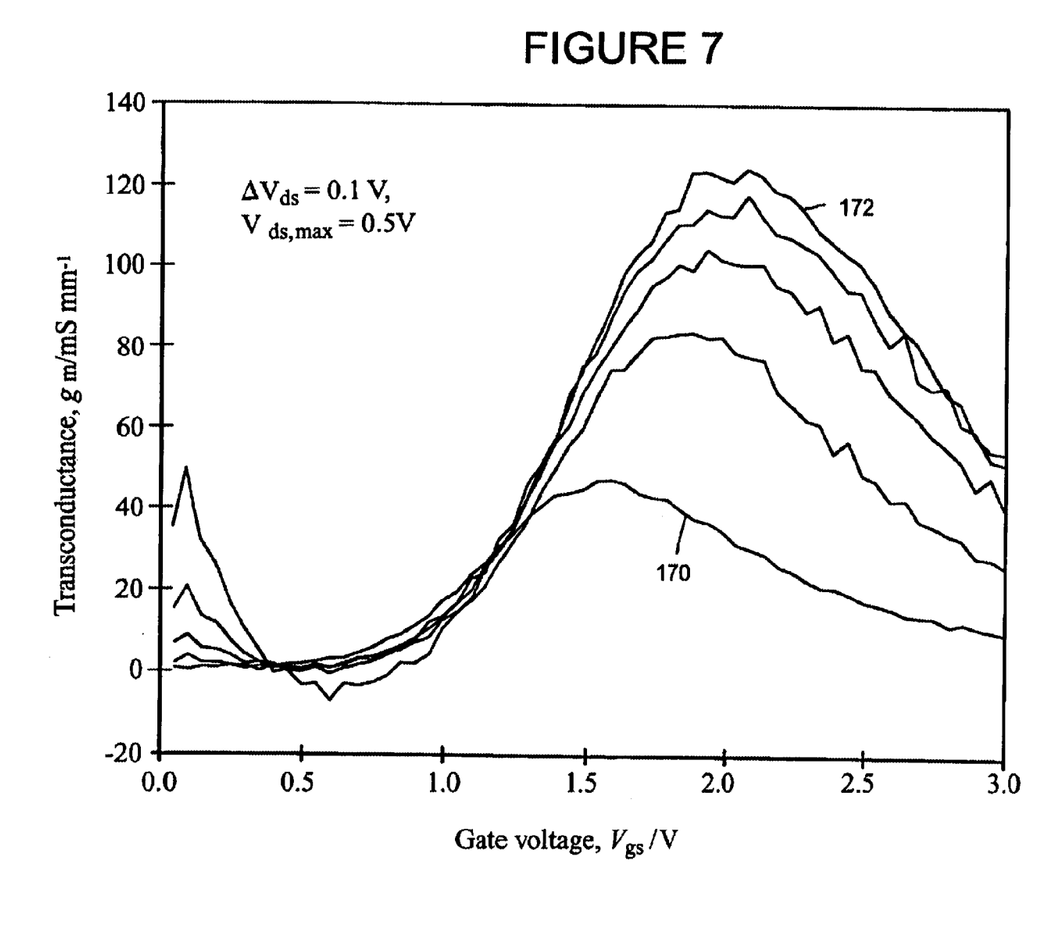
FIG. 7 graphically illustrates the transfer characteristic of the FIG. 3 MISFET.

The transfer characteristic of the MISFET 100 is shown in FIG. 7. It comprises five graphs such as 160 and 162 indicating the variation of transconductance $g_m$ with gate voltage $V_{gs}$ at constant gate voltage. The gate voltage changes between adjacent graphs from 0.1 V to 0.5 V in steps of 0.1 V. It can be seen that the maximum DC transconductance of the MISFET 100 is about 120 mS mm$^{-1}$, and the threshold gate voltage is about 0.4 V.

The leakage pedestal of the MISFET 100 is about 8 mA mm$^{-1}$ as shown by the intercept on the current axis in FIG. 6. The maximum drain currents are about 120 mA mm$^{-1}$, determined by the drain current ceasing to increase with gate voltage. The device starts to break down slowly at a drain voltage of around 0.5 V as indicated by the upward curvature of the current/voltage graphs at high drain voltage; this is due to band-to-band tunnelling and surface leakage (probably surface tunnelling generation), both of which it is possible to reduce. The MISFET 100 had a significant resistance in series with the channel, of about 2.5 Ohm on each side, measured by forward biasing the base-source/drain diodes. This is believed mainly to be due to the contacting process, and will reduce the transconductances (and hence $f_T$) below ideal values.

Figure 8:
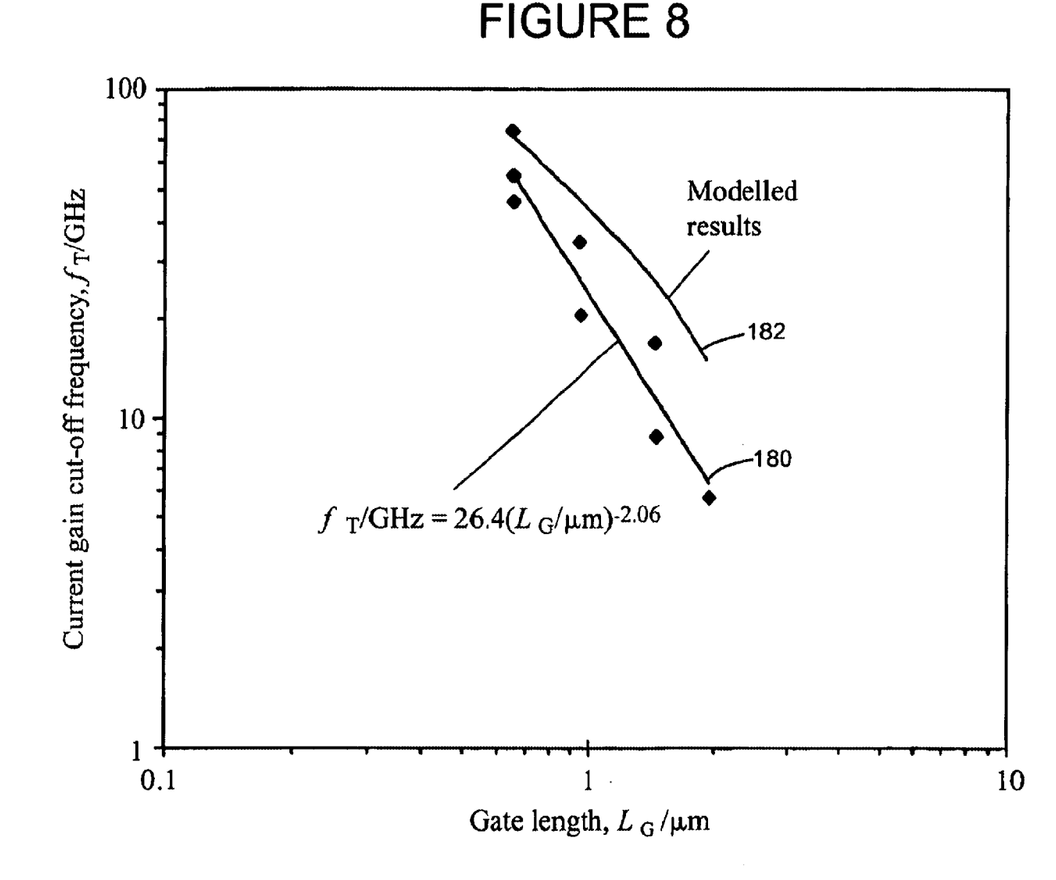
FIG. 8 illustrates the variation of current gain cut-off frequency with gate length for the FIG. 3 MISFET and for similar modelled devices.

The AC parameters of a number of enhancement mode MISFETs of the invention with differing gate lengths were measured by the S-parameter method with a drain voltage of 0.5 V, and the gate voltage was tuned for maximum $S_{21}$. Results were de-embedded from parasitic bond-pad capacitances using Koolen's method. FIG. 8 shows the measured maximum current gain cut-off frequencies $f_T$ as a function of gate length. The results follow a $L_G^{-2}$ dependence, as indicated by a lower line 180; this is as would theoretically be expected if the velocity is not saturated at pinch-off. Values of $f_T$ as a function of gate length were also calculated (modelled results) for these MISFETs, and indicated by an upper line 182; they agree fairly well with the experimental values, although they do show some effect of velocity saturation, presumably because the channel mobility used was higher. This suggests that further improvement is possible from reduced gate lengths.

Figure 9:
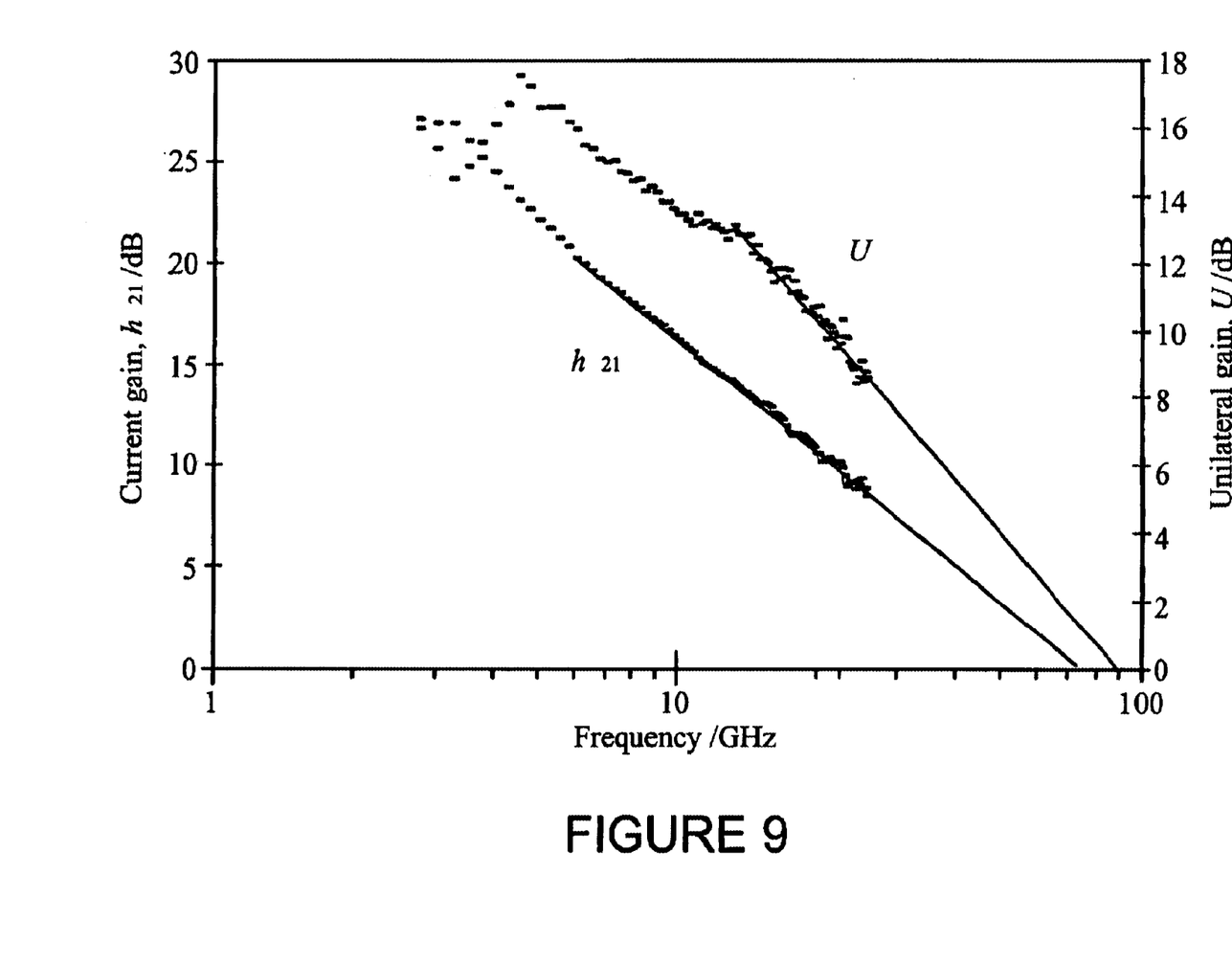
FIG. 9 illustrates the variation of AC gain parameters with frequency for the FIG. 3 MISFET.

The AC parameters of the MISFET 100 are shown in FIG. 9. The measured current gain cut-off frequency, $f_T$, is 74 GHz—as far as is known at present this is the highest $f_T$ measured for any FET with 0.7 $\mu$m gate length irrespective of transistor type or material. It is more than a factor of four greater than the best value (17 GHz) obtained for any of prior art devices 10 produced for investigation purposes, and more than a factor of seven greater than the typical value (10 GHz) for these devices. It should be possible to increase $f_T$ further by reducing the resistance in series with the channel. The frequency $f_{max}$ at which the unilateral power gain falls to unity is 89 GHz; this is limited by the channel series resistance, and by the output conductance which is relatively low at present. It should therefore be possible to achieve increased $f_{max}$ in devices of the invention. These values for $f_T$ and $f_{max}$ represent a great improvement over the prior art, and it is inferred that they provide confirmation of the correctness of the hypothesis of the deleterious effect of gate grooving on performance of prior art devices.

The results obtained for devices of the invention were very promising, and indicated the potential of the invention to provide high-speed, low-power devices. Modelling—ie calculation—of device characteristics was performed using ATLAS, a 2D drift-diffusion device simulator from Silvaco International, using published or measured results for InSb material parameters. The modelled results were tested against experimental p$^+$p$^+$πn$^+$ diodes and prior art MISFETs, and found to be in good agreement in terms of leakage currents, transconductance and $f_T$. Modelled results for an implanted enhancement-mode MISFET structures similar to that shown in FIG. 3 but with gate lengths of 1 $\mu$m and 0.25 $\mu$m are shown in the following Table 3, which provides theoretically attainable values for maximum $g_m$, $f_T$ and $f_{max}$. The values for 0.25 $\mu$m gate length assume the gate insulator oxide thickness to be scaled by the same factor as the gate length.

TABLE 2

Modelled Parameters for Enhancement-mode MISFETs of the Invention

| | | |
|---|---|---|
| Gate Length | 1.0 $\mu$m | 0.25 $\mu$m |
| Maximum g$_m$ | 188 mS mm$^{-1}$ | 500 mS mm$^{-1}$ |
| Current Gain Cut-off Frequency $f_T$ | 68 GHz | 185 GHz |
| Unity Unilateral Power Gain Frequency $f_{max}$ | 202 GHz | 264 GHz |

These maximum transconductance values represent a considerable improvement on that of 25 mS mm$^{-1}$ quoted for the prior art device of U.S. Pat. No. 5,382,814.

The MISFET 100 is an InSb/In$_{1-x}$Al$_x$Sb heterostructure. There are a number of other semiconductor material combinations that are suitable for construction of devices of the invention. Two semiconductor materials are required with differing bandgaps, but they need not be lattice matched. The lesser bandgap should be sufficiently narrow that it is possible to purify the material enough to exhibit predominantly intrinsic conductivity at the FET operating temperature (impossible with Si at the present time); this implies a bandgap which is in the region of or less than 0.5 eV for a device operating at ambient temperature of 295K, but materials of greater bandgap may be used for elevated operating temperatures.

Combinations of materials that may be used to produce FETs of the invention include PbSe/PbS, In$_{1-y}$Al$_y$Sb/In$_{1-x}$Al$_x$Sb, InAs/InAs$_{1-x}$P$_x$, InAs$_{1-x}$Sb$_x$/In$_{1-y}$Al$_y$Sb, InAs$_{1-x}$Sb$_x$/InAs$_{1-y}$P$_y$, GaAs/Ga$_{1-x}$Al$_x$As, In$_{1-x}$Ga$_x$Sb/In$_{1-y}$Al$_y$Sb and Hg$_{1-x}$Cd$_x$Te/Hg$_{1-y}$Cd$_y$Te. Values of the composition parameters x, or x and y must be suitably chosen. The MISFET consisted of InSb/In$_{1-x}$Al$_x$Sb, which is a special case of the second of these with the parameter y equal to zero.

Figure 10:
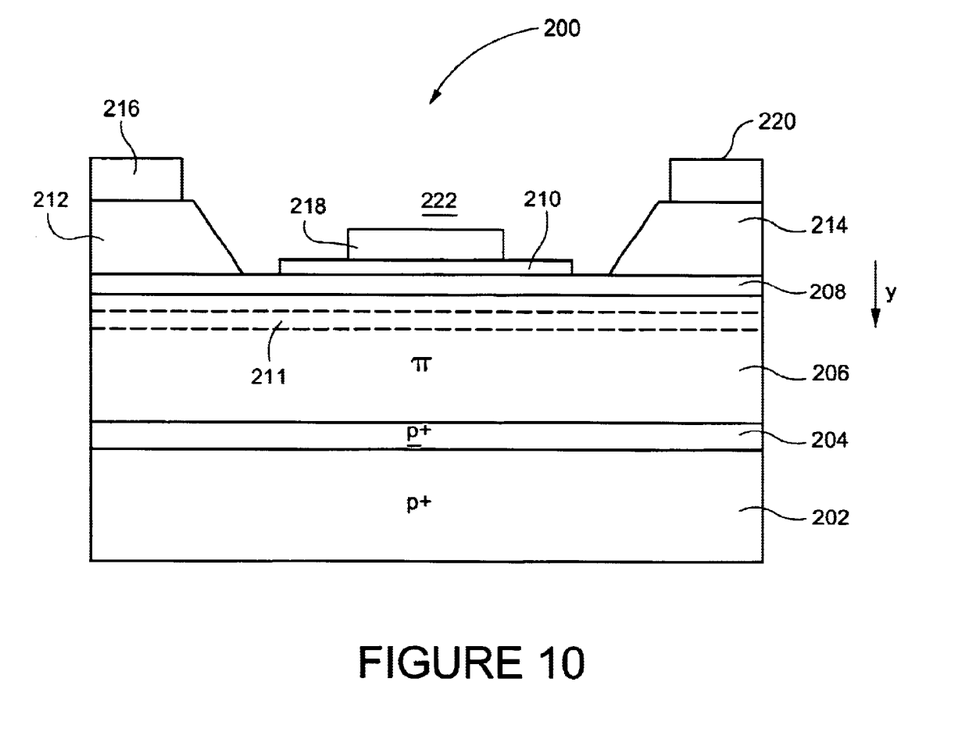
FIG. 10 is a schematic sectional view of an n-channel depletion mode MISFET of the invention (not drawn to scale)

Referring now to FIG. 10, a depletion mode MISFET of the invention is indicated generally by 200. It comprises a weakly doped p-type InSb substrate (not shown) upon which are grown five successive layers 202, 204, 206, 208 and 210 having the following thicknesses and composition:

first (base) layer 202: p$^+$ InSb 2 $\mu$m thick, Be dopant concentration 3×10$^{18}$ cm$^{-3}$;

second (barrier) layer 204: p$^+$ In$_{0.85}$Al$_{0.15}$Sb 20 nm thick, Be dopant concentration 3×10$^{18}$ cm$^{-3}$;

third (intrinsic) layer 206: πInSb 0.5 $\mu$m thick, Be dopant concentration 1×10$^{15}$ cm$^{-3}$; and fourth (channel) layer 208: p InSb 20 nm thick, Si dopant concentration 3×10$^{17}$ cm$^{-3}$;

fifth (gate insulation) layer 210: SiO$_2$ 70 nm thick.

The MISFET 200 may optionally include a buried p-type layer 211 (indicated by chain lines) within the intrinsic layer 206 to improve confinement of charge carriers near the gate insulation layer 210. It has n⁺ source and drain regions 212 and 214 each approximately 0.2 μm thick with an Si dopant concentration of $2\times10^{18}$ cm$^{-3}$ and forming extracting contacts to the channel layer 208. These regions provide carrier extraction in the intrinsic layer 206 via the channel layer 208. The MISFET 200 has source, gate and drain contacts 216, 218 and 220 consisting of successive Cr and Au layers (not shown). Except where indicated above, the MISFET 200 has dimensions similar to the enhancement mode device described earlier. It has a mesa length 12 μm, a mesa (and gate) width of 50 μm and gate contact length nominally 0.7 μm. The layers 202 to 208 were grown by molecular beam epitaxy (MBE). The source and drain regions 212 and 214 were produced by MBE growth on the channel layer 208, the central region of the latter being masked to avoid growth upon it. After removal of this mask, the gate insulation layer 210 and electrode 218 are deposited. The source and drain regions 212 and 214 define between them a gate recess 222 within which the gate insulation layer 210 and gate contact 218 are located supported by the channel layer 208. The recess may be more or less deep than the height of the gate electrode 218. It is important to note that the gate recess 222 is not a groove produced by etching as in the prior art, but instead a recess defined by growth of upstanding sides. In consequence the formation of the recess 222 does not imply problems associated with too deep a groove affecting channel shape.

The fifth layer 210 consisted of 40 nm of sputtered SiO₂ deposited on top of 30 nm of anodic oxide. The gate contact 218 extends over most of that part of the channel layer 208 which is between the source and drain regions 212 and 214; the degree to which it does this is not very critical because it is merely required for modulation/depletion of an existing device channel, as opposed to establishment of a complete channel between source and drain which is required in an enhancement mode device.

The MISFET 200 employs a channel layer 208 to provide an accessible source of electrons; the latter in turn provides a conducting path from source 212 to drain 214 depletable of charge carriers by the gate electrode potential. This path may be entirely within the channel layer 208 or the intrinsic layer 206 or may be partly in one of these and partly in the other. The threshold voltage of the MISFET 200 is determined by the doping per unit area of the channel layer 208, ie the product of the layer thickness and its doping per unit volume. The channel layer 208 extends substantially along the direction of the electric field produced by the source-drain voltage in the absence of a gate voltage. This layer is not U-shaped to any unacceptable degree; ie any concavity or convexity in this layer is less than 50 nm in extent.

Modelled—ie theoretical—performance figures were obtained for the depletion-mode MISFET 200 assuming that the gate insulation oxide thickness was equal to that in the device 100. These figures are shown in Table 3 as follows:

TABLE 3

Modelled Parameters for Depletion-mode MISFETs of the Invention

| | | |
|---|---|---|
| Gate Length | 1.0 μm | 0.25 μm |
| Maximum $g_m$ | 190 mS mm⁻¹ | 590 mS mm⁻¹ |
| Current Gain Cut-off Frequency $f_T$ | 68 GHz | 220 GHz |
| Unity Unilateral Power Gain Frequency $f_{max}$ | 164 GHz | 377 GHz |

Figure 11:
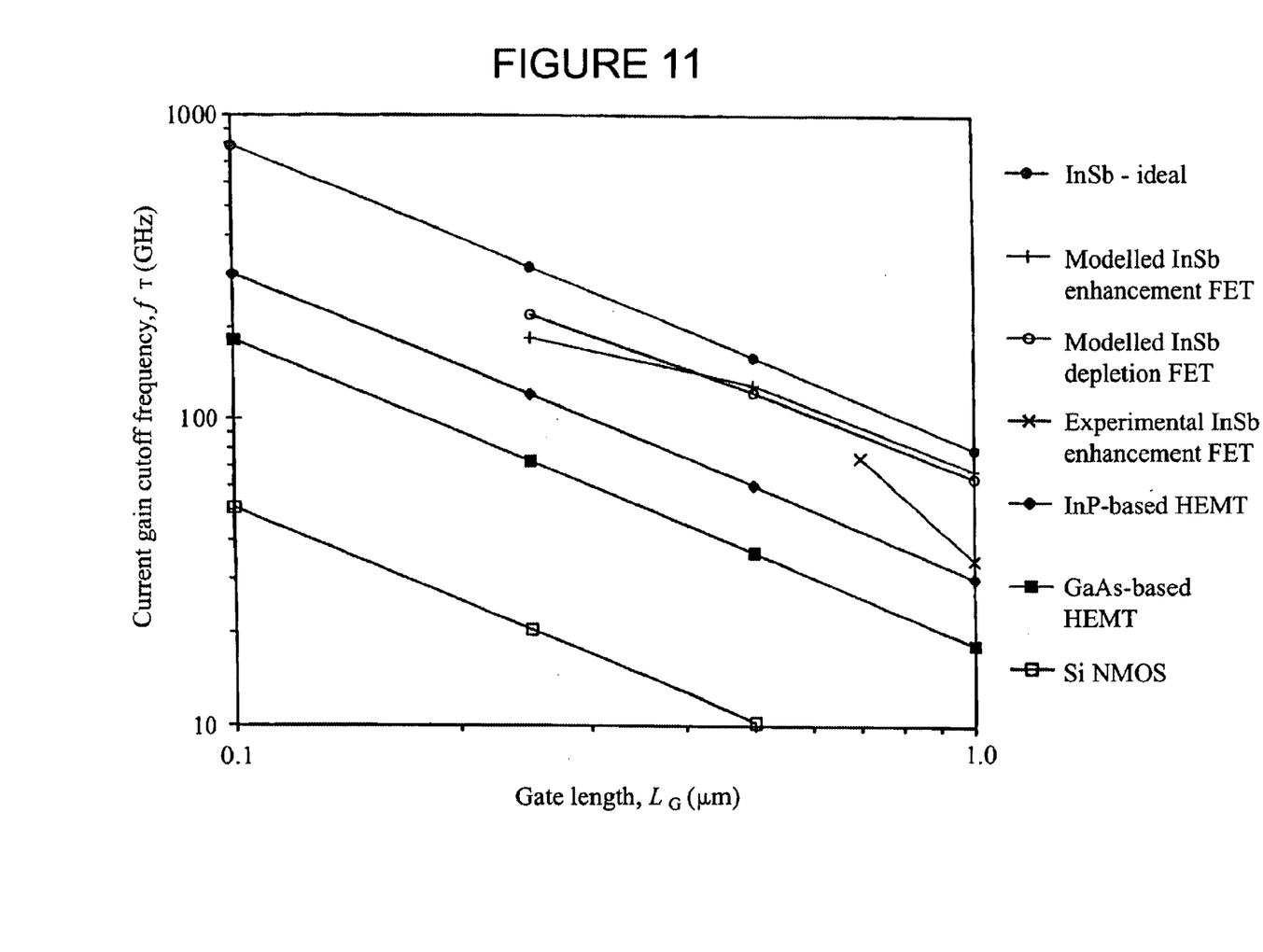
FIG. 11 illustrates the variation of current gain cut-off frequency $f_T$ (GHz) as a function of gate length ($\mu$m) for a variety of device technologies, both measured and modelled.

Referring to now to FIG. 11, current gain cut-off frequency $f_T$ (GHz) is shown as a f+unction of gate length (μm) for a variety of device technologies, actual or modelled, as follows: InSb ideal—(calculated from gate length and carrier velocity only), modelled InSb enhancement and depletion mode MISFETs, the InSb enhancement mode MISFET 100 InP—and GaAs-based HEMTs and silicon NMOS.

It can be seen that the Table 2 results for $f_T$ in the MISFET 100 are only slightly below the ideal trend-line in FIG. 11, with a slight tailing off due to the overlap capacitance from the source and drain implants. These results should be attainable with improved performance from the implanted diodes, reduced series resistance and patterning of the gate oxide to reduce overlap capacitance. Comparison of the Table 3 results for $f_T$ in the MISFET 200 with FIG. 11 indicate that this depletion-mode device does not suffer from the saturation effect seen in the enhancement-mode devices such as the MISFET 100 and this is attributed to the former having lower input capacitance.

The MISFET 200 may have a different form of channel. The 20 nm thick channel layer 208 may be replaced by a 3 nm thick InSb channel layer with a Si dopant concentration of $2\times10^{18}$ cm$^{-3}$ separated from the gate oxide layer 210 by a π InSb layer 20 nm thick with a dopant concentration of $1\times10^{15}$ cm$^{-3}$. This is equivalent to the channel layer being reduced in thickness and buried in the intrinsic π layer 206, and is estimated to give a 30% operating speed enhancement. In this case the source and drain regions 212 and 214 form extracting contacts with the intrinsic layer 206.

Figure 12:
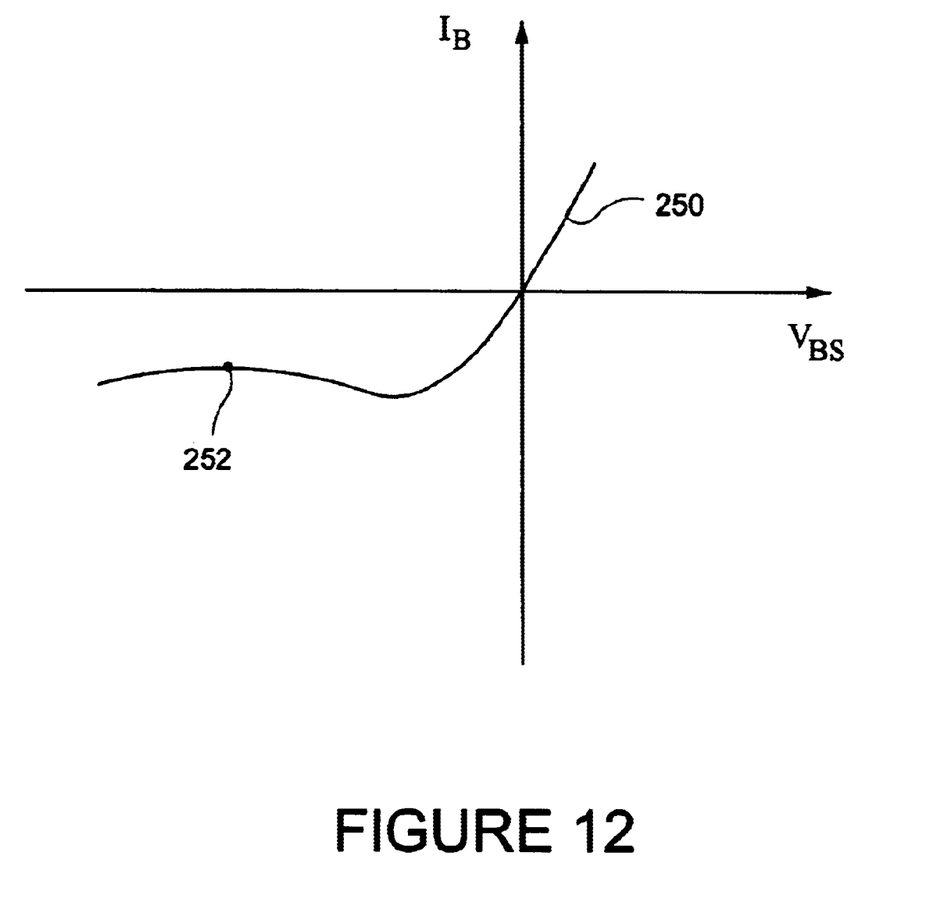
FIG. 12 is a base current/voltage characteristic theoretically achievable for a MISFET of the kind in which carrier concentration is depressed by exclusion and extraction.

Referring now to FIG. 12, there is shown a base current/voltage $I_B V_{BS}$ characteristic 250 which is theoretically achievable by a MISFET of the kind in which carrier concentration is depressed by exclusion and extraction. Here the base current is that flowing between a base layer and a source region. This current is not for the purposes of biasing the MISFET source, gate and drain relative to one another. Instead it is for the purposes of reducing the carrier concentration and leakage current in the intrinsic device region. The characteristic 250 corresponds to a device containing a lower Shockley/Read trap density than is currently attainable. The device is a p⁺p⁺πn⁺ diode structure which is reverse biased in operation, ie it has a base layer which is biased negative with respect to its source region. Under this bias, carrier extraction and exclusion take place in the intrinsic layer, from which electrons (minority carriers) are removed by an associated πn⁺ junction acting as an extracting contact.

At a point 252, the slope of the $I_B V_{BS}$ characteristic 250 is zero, indicating infinite differential impedance. At this point, the variation of gate threshold voltage with base bias voltage $V_{BS}$—referred to as "back gating"—is minimised, and so this is the preferred operating point for base bias.

The modelled results referred to above come from drift-diffusion simulation and neglect ballistic effects, which are expected to become significant at gate lengths of around 0.5 μm. The effect of this will be to increase the average saturation velocity, and hence the $g_m$ and $f_T$ leading to potential for greater improvements in performance.

Transistors of the invention are potentially applicable to high-speed analogue device applications. If grown on a semi-insulating substrate or virtual substrate, they could be used in microwave integrated circuits. An InSb device is operative at low voltage, less than 0.5 V, and is therefore characterised by low power consumption which is extremely useful for hand-held applications, providing longer battery lifetimes. Also, it has high electron velocity which allows higher ultimate frequencies to be reached, or alternatively provides the required operating speed at a longer gate length, making it more robust. Transistors of the invention may also be used as digital devices, especially for low-complexity circuits. They are very attractive for high-speed low-power applications because they potentially have a very low Pτ product, where P is energy dissipated in a switching operation and τ is the time to switch.

The invention provides FETs which are fast, have low power dissipation and exploit the inherent high electron mobility and saturation velocity of InSb/In$_{1-x}$Al$_x$Sb. These FETs give high-speed, low-power performance and demonstrate off-state leakage currents which are well below levels normally associated with InSb/In$_{1-x}$Al$_x$Sb, due to the incorporation of carrier exclusion and extraction techniques. MISFETs of the invention with 0.7 μm gate length have the highest f$_T$ value yet reported for this gate length, and further improvements in both speed and off-state leakage are expected to be obtainable.

What is claimed is:

1. An improvement to a field effect transistor (FET) of the kind including a region having intrinsic conductivity when unbiased at an operating temperature of the FET and biasing means for depressing the intrinsic contribution to the charge carrier concentration in the intrinsic region, said improvement comprising a means for defining a channel extending between a source region and a drain region with any intervening departure from channel straightness being not more than 50 nm, thereby enabling a high value of current gain cut-off frequency to be obtained.

2. An FET according to claim 1 wherein any departure from channel straightness is not more than 5 nm.

3. An FET according to claim 1, wherein the PET is an enhancement mode MISFET.

4. An PET according to claim 1, wherein the FET incorporates source and drain regions which are heavily doped n-type.

5. An PET according to claim 1, wherein the intrinsic region is p-type and forms extracting contact means in combination with the source and drain regions.

6. A field effect transistor (PET) of the kind including a region having intrinsic conductivity when unbiased at an operating temperature of the PET and biasing means for depressing the intrinsic contribution to the charge carrier concentration in the intrinsic region, further including means for defining a channel extending between a source region and a drain region with any intervening departure from channel straightness being not more than 50 nm, thereby enabling a high value of current gain cut-off frequency to be obtained, wherein the intrinsic region has an interface with a barrier region (104) itself having an interface with a base region, and wherein the intrinsic, barrier and base regions are of like conductivity type and the barrier region is of relatively wider bandgap than the intrinsic and base regions and provides an excluding contact to the intrinsic region.

7. An FET according to claim 6, further including a gate contact insulated from and extending at least over that part of the intrinsic region between the source and drain regions to define an enhancement channel therebetween in operation.

8. An FET according to claim 6 wherein:
 a) the base region is of p$^+$ InSb and has an acceptor concentration of at least 5×10$^{17}$ cm$^{-3}$;
 b) the barrier region is of p$^+$ In$_{1-x}$Al$_x$Sb with x in the range 0.05 to 0.25 and has an acceptor concentration of at least 5×10$^{17}$ cm$^3$;
 c) the intrinsic region is of π InSb with an acceptor concentration of less than 5×10$^{17}$ cm$^{-3}$, preferably in the range 1×10$^{15}$ cm$^{-3}$ to 5×10$^{16}$ cm$^{-3}$; and
 d) the source and drain regions are of n$^+$ InSb with a dopant concentration of at least 5×10$^{17}$ cm$^{-3}$.

9. A FET according to claim 5, wherein the base, barrier and intrinsic regions are successively disposed in a layer structure, and the intrinsic region has a substantially flat surface portion supporting a gate insulation layer and a gate contact.

10. A field effect transistor (FET) of the kind including a region having intrinsic conductivity when unbiased at an operating temperature of the PET and biasing means for depressing the intrinsic contribution to the charge carrier concentration in the intrinsic region, further including means for defining a channel extending between a source region and a drain region with any intervening departure from channel straightness being not more than 50 nm, thereby enabling a high value of current gain cut-off frequency to be obtained, wherein the PET is a depletion mode MISFET having an associated channel region.

11. An PET according to claim 10, wherein the FET incorporates source and drain regions which are heavily doped outgrowths formed upon either the intrinsic region or the channel region, the outgrowths defining therebetween a gate recess accommodating a gate contact.

12. An FET according to claim 10, wherein the intrinsic region is p-type and either itself or the channel region forms extracting contact means with the source and drain regions.

13. An FET according to claim 10, wherein the intrinsic region has an interface with a barrier region which itself has an interface with a base region, and wherein the intrinsic, barrier and base regions are of like conductivity type and the barrier region is of relatively wider bandgap than the intrinsic and base regions and provides an excluding contact to the intrinsic region.

14. An FET according to claim 13, wherein:
 e) the base region is of p$^+$ InSb and has an acceptor concentration of at least 5×10$^{17}$ cm$^{-3}$;
 f) the barrier region is of p$^+$ In$_{1-x}$Al$_x$Sb with x in the range 0.05 to 0.25 and has an acceptor concentration of at least 5×10$^{17}$ cm$^{-3}$;
 g) the intrinsic region is of it InSb with an acceptor concentration of less than 5×10$^{17}$ cm$^{-3}$, preferably in the range 1×10$^{15}$ cm$^{-3}$ to 5×10$^{16}$ cm$^{-3}$; and
 h) the source and drain regions are of n$^+$ InSb with a donor concentration of at least 5×10$^{17}$ cm$^{-3}$.

15. A FET according to claim 13, wherein the intrinsic region supports a channel region, the base, barrier, intrinsic and channel regions are successively disposed in a layer structure, the source and drain regions are grown upon the channel region and the channel region has a substantially flat surface portion supporting a gate insulation layer and a gate contact.

16. An FET according to claim 15, wherein the source and drain regions define therebetween a gate recess, the channel region has a surface portion at an end of the recess supporting a gate insulation layer and a gate contact.

17. An FET according to claim 10, wherein the channel region lies between parts of the intrinsic region and the latter forms extracting contact means in combination with the source and drain regions.

18. An FET according to claim 17, wherein the base, barrier and intrinsic regions are successively disposed in a layer structure, the intrinsic region contains the channel region, the source and drain regions are supported by the intrinsic region and define therebetween a gate recess, and the intrinsic region has a surface portion at an end of the recess supporting a gate insulation layer and a gate contact.

19. A field effect transistor (FET) of the kind including a region having intrinsic conductivity when unbiased at an operating temperature of the FET and biasing means for depressing the intrinsic contribution to the charge carrier concentration in the intrinsic region, said FET further including means for defining a channel extending between a source region and a drain region with any intervening departure from channel straightness being not more than 50 nm, thereby enabling a high value of current gain cut-off frequency to be obtained, wherein the biasing means for depressing the intrinsic contribution to the charge carrier concentration in the intrinsic region is arranged to bias the PET at a point of infinite differential impedance where the variation of gate threshold voltage with substrate bias voltage variations is minimised.

20. A method of making an PET of the kind comprising biasing means for depressing the intrinsic contribution to the charge carrier concentration in an intrinsic region thereof, said method including the step of defining a channel extending between a source region and a drain region such that any intervening departure from channel straightness is not more than 50 nm, thereby enabling a high value of current gain cut-off frequency to be obtained.

21. A method of making an FET according to claim 20, wherein any departure from channel straightness is not more than 5 nm.

* * * * *

UNITED STATES PATENT AND TRADEMARK OFFICE
CERTIFICATE OF CORRECTION

PATENT NO. : 6,624,451 B2
DATED : September 23, 2003
INVENTOR(S) : Ashley et al.

It is certified that error appears in the above-identified patent and that said Letters Patent is hereby corrected as shown below:

Title page,
Item [75], Inventors, "Anthony B. Dean" should read -- Antony B. Dean --.

Column 9,
Line 10, "160 and 162" should read -- 170 and 172 --.
Line 12, "gate voltage. The gate" should read -- drain voltage. The drain --.

Column 10,
Line 61, "πInSb" should read -- π InSb --.

Column 11,
Line 66, "f+unction" should read -- function --.

Column 13,
Lines 29, 31, 34, 37 and 39, "PET" should read -- FET --.

Column 14,
Lines 8, 15 and 17, "PET" should read -- FET --.
Line 43, "A FET" should read -- An FET --.

Column 15,
Line 10, "PET" should read -- FET --.

Column 16,
Line 1, "PET" should read -- FET --.

Signed and Sealed this

Sixteenth Day of March, 2004

JON W. DUDAS
*Acting Director of the United States Patent and Trademark Office*